United States Patent
Tzu

(10) Patent No.: US 6,211,563 B1
(45) Date of Patent: Apr. 3, 2001

(54) SEMICONDUCTOR PACKAGE WITH AN IMPROVED LEADFRAME

(75) Inventor: Chung-Hsing Tzu, Taipei (TW)

(73) Assignee: Sampo Semiconductor Cooperation, Taoyuan Hsein (TW)

( * ) Notice: Subject to any disclaimer, the term of this patent is extended or adjusted under 35 U.S.C. 154(b) by 0 days.

(21) Appl. No.: 09/343,516

(22) Filed: Jun. 30, 1999

(51) Int. Cl.[7] ................................. H01L 23/495
(52) U.S. Cl. .................. 257/678; 257/666; 257/667; 257/668; 257/669; 257/670; 257/671; 257/672; 257/673; 257/674; 257/675; 257/676
(58) Field of Search ............................ 257/783, 666–676, 257/691, 678

(56) References Cited

U.S. PATENT DOCUMENTS 5,612,569 * 3/1997 Murakami et al. .................. 257/783

* cited by examiner

Primary Examiner—Fetsum Abraham
(74) Attorney, Agent, or Firm—Sughrue, Mion, Zinn, Macpeak & Seas, PLLC

(57) ABSTRACT

The leadframe of the present invention comprises a supporting bar having the first terminals and the second terminals, wherein the first terminals are coupled to the separating portion of the leadframe and the second terminals are used to support the chip. A plurality of inner leads connected to the supporting bar. A plurality of external leads connected to the inner leads; Adhesive material, formed on the leadframe and used to attach the chip to the inner leads, wherein the area of adhesive material is smaller than that of said chip. A plurality of bonding wires is used to couple the chip to the leadframe. Finally, the chip is encapsulated with the molding compound to protect the chip and the bonding wires.

19 Claims, 3 Drawing Sheets

SEMICONDUCTOR PACKAGE WITH AN IMPROVED LEADFRAME

BACKGROUND OF THE INVENTION

1. Field of the Invention

The present invention relates to a semiconductor package, and more particularly, to a semiconductor package wherein the chip is attached to the leadframe.

2. Description of the Prior Art

While the size of periphery of semiconductor chip is decreased, the position of bonding pads must be taken care simultaneously to prevent the supporting bar from contacting with the leadframe, which results in the failure of electronic property. In general, the package with LOC (lead on chip) structure increases the package density and improves the performance. In past, the conventional package includes the leadframe having the die pad for supporting the chip. In the conventional package having the leadframe, as shown in FIG. 1 and FIG. 3, the chip is positioned onto the die pad whose size is larger than that of the chip. To describe the conventional package having leadframe more detail, the chip 20 is attached to the die pad 80 and then electrically coupled to the leadframe 10 by the bonding wires 30 for transmitting signal; the molding compound is used to encapsulate the above leadframe 10 and the chip 20 to form a complete package body that also protect the bonding wires 30 from break resulted from the external force. However, the package body may be broken due to the stress resulted from "the popcorn effect", caused by the evaporated moisture during the under-filling process for injecting the molding compound. To explain "the popcorn effect" more detail, the delamination or gap is liable to form between the die pad and the molding compound due to the poor adhesion. Therefore, the moisture may be absorbed by the delamination or gap within the package body during the storage stage, and then the moisture will be evapored after the package body being moved into the furnace for heating. Thus, the cracks caused by the evaporated moisture will break the package body. One method for solving "the popcorn effect" that cause the cracks is to carry out the baking process, which is executed before the package body moved into the furnace, to remove the moisture. Another method is to form a plurality of through holes, such as heat exhausting holes, to drive out the moisture.

SUMMARY OF THE INVENTION

One of the objects of the present invention is using the materials having lower moisture absorption to prevent "the popcorn effect". Such the material, such as polyimide tape, also serves as the adhesive material to attach the chip to the leadframe. Another object of the present invention is to reduce the influence of unmatched CTE (coefficient of thermal expansion) on the conjunction between the metal and the high polymer.

The present invention also provides an adhesive material, such as the polyimide tape, by which the chip is attached to the leadframe. The present invention also provides the supporting bar to replace the die pad for supporting the chip. The chip is attached to th e supporting bar by thermal compress or the silver epoxy.

The package body of the present invention concludes the leadframe and the chip on the surface of the leadframe. The chip may be formed on the leadframe by the flip-On-chip technology. The chip is electrically coupled to the leadframe by the bonding wire, to electrically transmit signal to external. A plurality of external leads are connected to the supporting bar, respectively. The terminals of the supporting bar are connected to the separating portion of the leadframe and the other terminals of the supporting bar are used to support the chip. The separating portion is used to separate the leadframe from the side rail not shown) in the separating procedure.

Each terminal of the inner leads is connected to external leads by the separating portion of the leadframe. An adhesive material is attached to the surface of the leadframe. The size of the chip is larger than that of tape. The chip is attached to the supporting bar by thermal compress or the silver epoxy, it is worthy noting that the size of the chip is smaller than that of die pad to prevent the excessive silver epoxy oozes. Then, the molding compound is used to encapsulate the chip and the leadframe to form a complete package body.

In the preferred embodiment of the present invention, the package body having the leadframe and the adhesive material are used to eliminate unmatch of CTE (coefficient of thermal expansion) of conjunction between the metal and the high polymer material. The present invention also provides the adhesive material to replace the die pad. Thus, the problem resulted from stress is eliminated while the chip and the leadframe is encapsulated with the molding compound.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The objects of the present invention is to eliminate "the popcorn effect" and the influence of mismatched CTE (coefficient of thermal expansion) on the conjunction between the metal and the high polymer material.

Figure 1:
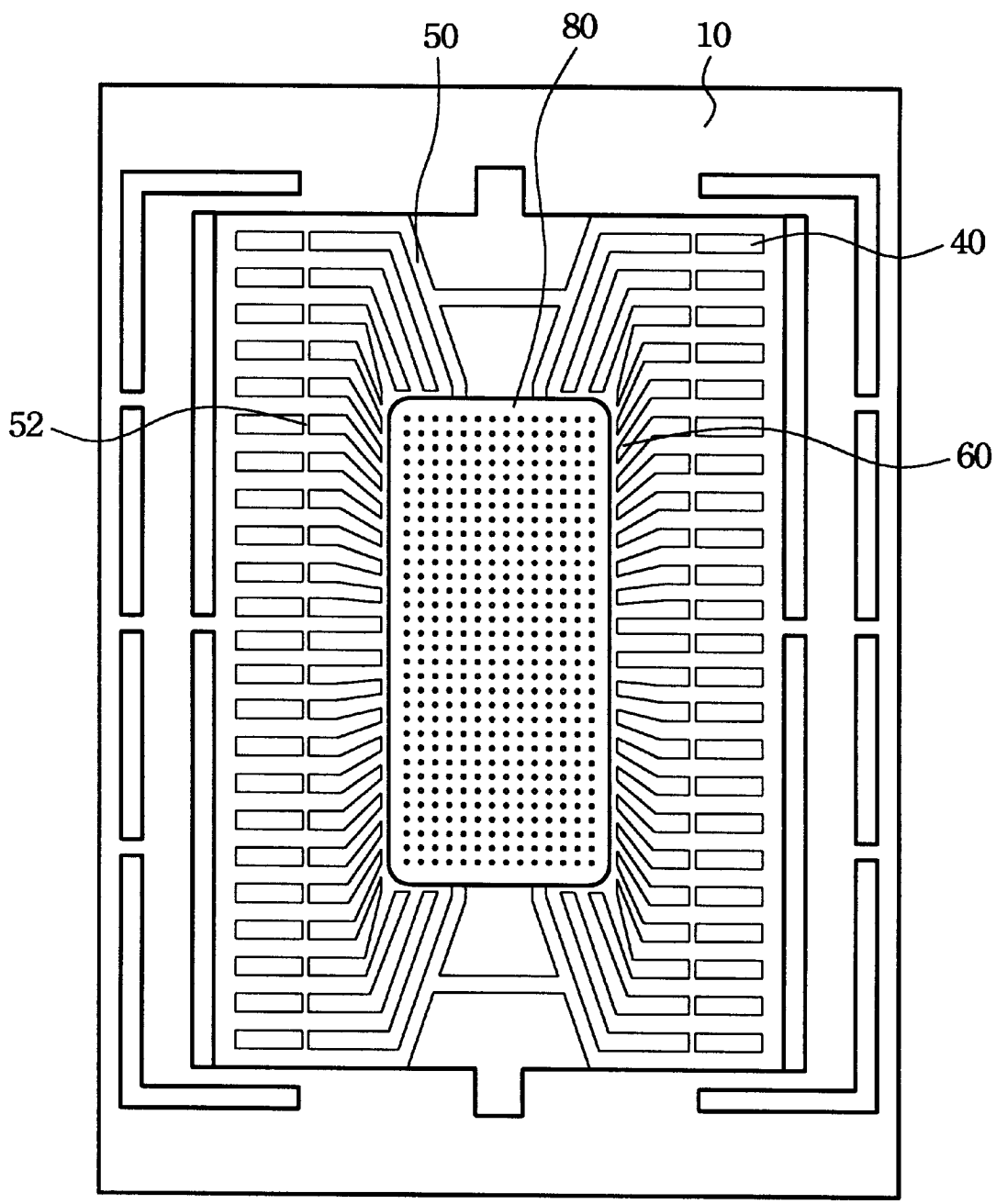
FIG. 1 is the top view of conventional leadframe within the semiconductor package.
Figure 2:
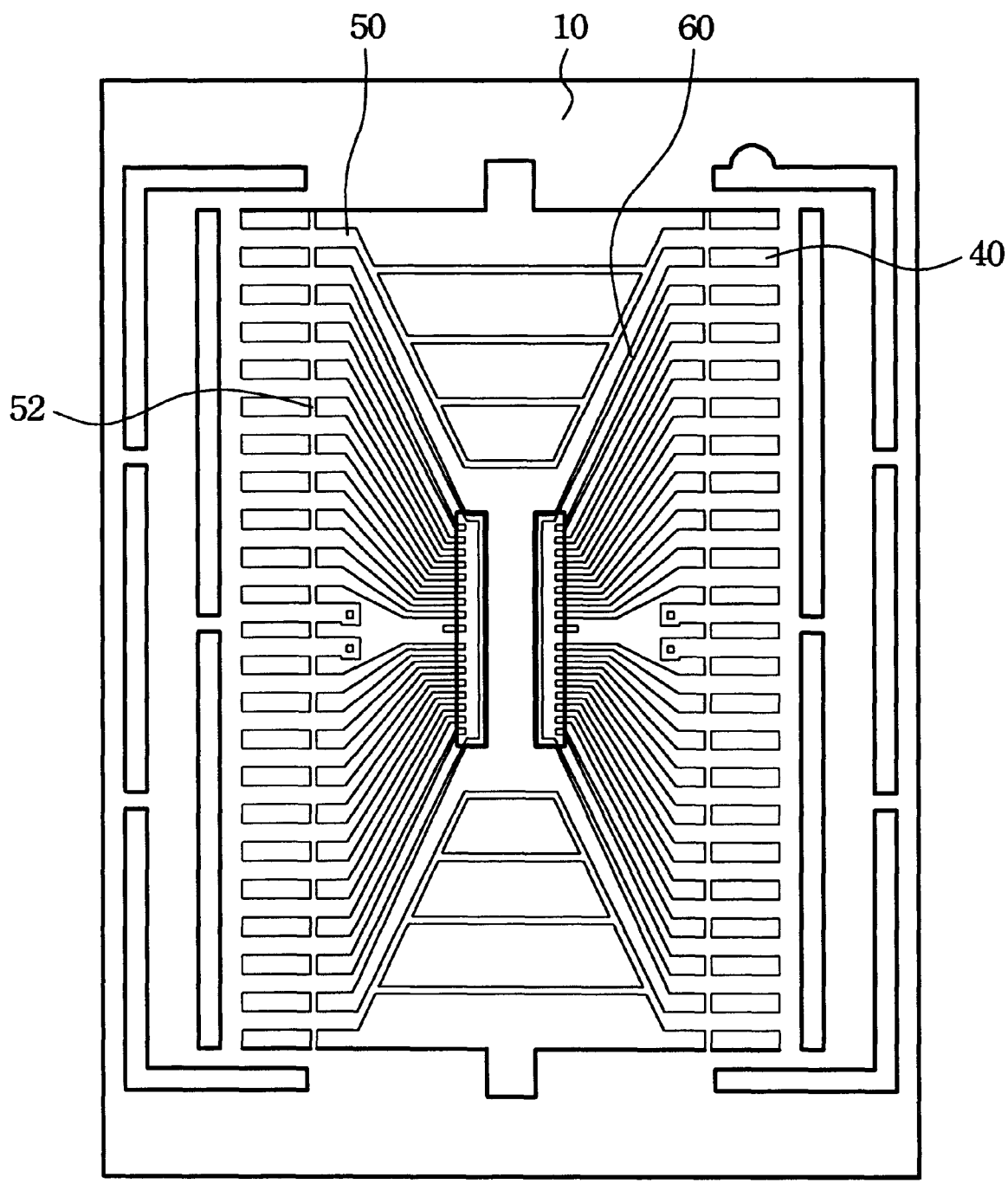
FIG. 2 is the top view of leadframe within the semiconductor package of the present invention.
Figure 3:
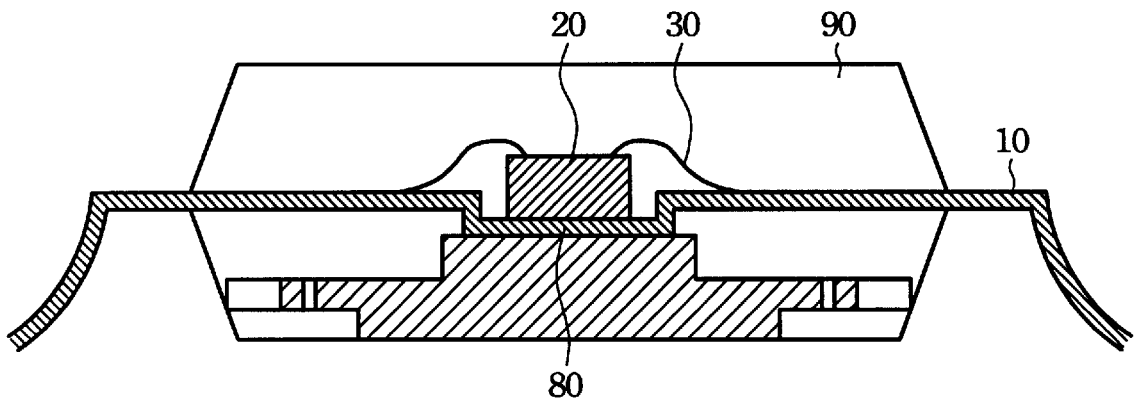
FIG. 3 is the side view of conventional leadframe within the semiconductor package.
Figure 4:
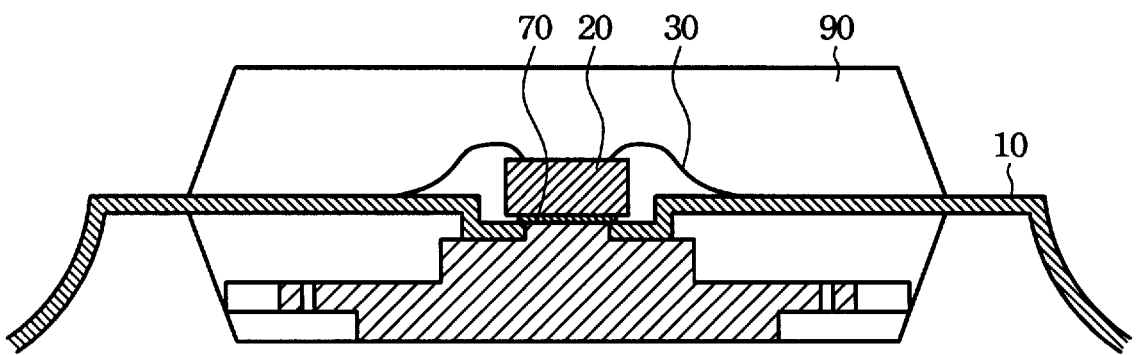
FIG. 4 is the side view of leadframe within the semiconductor package of the present invention.

According to the preferred embodiment of present invention (as shown in FIG. 2 and FIG. 4), the package body of the present invention concludes the leadframe 10 and the chip 20 on the surface of the leadframe 10. The chip 20 may be formed on the leadframe 10 by the flip-On-chip technology. The chip 20 is electrically coupled to the leadframe 10, by the bonding wire 30, to electrically transmit signal to external. A plurality of external leads 40 are connected to the supporting bar 50, respectively. The terminals of the supporting bar 50 are connected to the separating portion 52 of the leadframe 10 and the other terminals of the supporting bar 50 are used to support the chip 20. The separating portion 52 is used to separate the leadframe 10 from the side rail (not shown) in the separating procedure.

Each terminal of the inner leads 60 is connected to the external leads 40 by the separating portion 52 of the leadframe 10. An adhesive material 70, such as the tape made of polyimide or the high polymer material, is used to attach the chip 20 to the surface of the leadframe 10 and prevent the occurrence of the popcorn effect and the problem caused by stress. If the amount of the adhesive material 70 is excessive, the adhesive material 70 is liable to ooze out from the bottom of the chip 20 and cause the occurrence of gap or peeling off due to the poor adherence between the adhesive material 70 and the molding compound. In order to prevent the excessive amount of adhesive material 70 from oozing, the size of the chip 20 must be larger than that of tape. However, if the amount of adhesive material 70 is controlled precisely, the manner that the size of the chip 20 is smaller than that of the tape is allowable. The adhesive material 70 is attached to the supporting bar by thermal compress or the silver epoxy. Then, a molding compound 90, such as the resin, is filled in to encapsulate the chip 20 and the leadframe 10 (as shown in FIG. 4) to form a complete package body.

In the preferred embodiment of the present invention, the package body having the leadframe 10 and the adhesive material 70 are used to eliminate unmatch of CTE (coefficient of thermal expansion) of conjunction between the metal and the high polymer material. The present invention also provides the adhesive material 70, such as tape made of polyimide or the high polymer material, to replace the die pad. Thus, the popcorn effect and the problem resulted from stress is eliminated while the chip 20 and the leadframe 10 is encapsulated with the molding compound 90 because that contact between the leadframe 10, made of metal, and the molding compound 90, such as the resin, has been reduced.

Referring to FIG. 4, the cross section view of the present invention, the chip is attached onto the recessed portion of leadframe 10. Accordingly, the adhesive material 70 saves the provision of die pad. From FIG. 4, it will be note that the contact between the leadframe 10 and the molding compound 90 has been reduced effectively. Therefore, the mismatch of CTE resulted from the conjunction between the leadframe 10 and the chip 20 is reduced. Moreover, the adhesive material 70 having lower moisture absorption prevent the popcorn effect.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A semiconductor package having a leadframe, said semiconductor package comprising:
   a supporting bar having a first terminal and a second terminal, said first terminal being coupled to a separating portion of said leadframe and said second terminal being used to used to support a chip;
   a plurality of inner leads, connected to said supporting bar;
   a plurality of external leads, connected to said inner leads;
   an adhesive material, formed on said leadframe and used to attach said chip to said inner leads, wherein said adhesive material is formed between said second terminal of said supporting bar and said chip, and said adhesive material and said second terminal of said supporting bar are located at the same side of said chip;
   a plurality of bonding wires for coupling said chip to said leadframe, wherein said plurality of bonding wires and said chip are located at the same side of said adhesive material; and
   an encapsulant for encapsulating said chip and said bonding wires.

2. The semiconductor package according to claim 1, wherein an area of said adhesive material is smaller than that of said chip.

3. The semiconductor package according to claim 1, wherein said adhesive material comprises a polyimide tape or printed circuit board (PCB).

4. The semiconductor package according to claim 1, wherein said inner leads conclude a portion coated with silver.

5. The semiconductor package according to claim 1, wherein said chip is attached to said supporting bar by thermal compress.

6. The semiconductor package according to claim 1, wherein said chip is attached to said supporting bar by silver epoxy.

7. The semiconductor package according to claim 1, wherein said encapsulant comprises an epoxy resin.

8. A semiconductor package having a leadframe, said semiconductor package comprising:
   a supporting bar having a first terminal and a second terminal, said first terminal being coupled to a separating portion of said leadframe and said second terminal being used to support a chip;
   a plurality of inner leads, connected to said supporting bar;
   a plurality of external leads, connected to said inner leads;
   an adhesive material, formed on said leadframe and used to attach said chip to said inner leads, wherein said adhesive material is formed between said second terminal of said supporting bar and said chip, and said adhesive material and said second terminal of said supporting bar are located at the same side of said chip;
   a plurality of bonding wires for coupling said chip to said leadframe, wherein said plurality of bonding wires and said chip are located at the same side of said adhesive material; and
   a molding compound for encapsulating said chip and said bonding wires.

9. The semiconductor package according to claim 8, wherein an area of said adhesive material is smaller than that of said chip.

10. The semiconductor package according to claim 8, herein said adhesive material comprises a polyimide tape or a high polymer material.

11. The semiconductor package according to claim 8, wherein said inner leads concludes a portion covered with silver.

12. The semiconductor package according to claim 8, wherein said chip is attached to said supporting bar by thermal compress.

13. The semiconductor package according to claim 8, wherein said chip is attached to said supporting bar by a silver epoxy.

14. A semiconductor package having a leadframe, said semiconductor package comprising:
   a supporting bar having a first terminals and a second terminals, said first terminals being coupled to a separating portion of said leadframe and said second terminal being used to support a chip;
   a plurality of inner leads, connected to said supporting bar;
   a plurality of external leads, connected to said inner leads;
   a tape, formed on said leadframe and used to attach said chip to said inner leads, wherein said tape is formed between said second terminal of said supporting bar and said chip, and said tape and said second terminal of said supporting bar are located at the same side of said chip;

a plurality of bonding wires, used to couple said chip to said leadframe, wherein said plurality of bonding wires and said chip are located at the same side of said tape; and a molding compound, used to encapsulate said chip and said bonding wires.

15. The semiconductor package according to claim 8, wherein an area of said adhesive material is smaller than that of said chip.

16. The semiconductor package according to claim 8, wherein said tape comprises a polyimide tape or a high polymer material.

17. The semiconductor package according to claim 8, wherein said inner leads concludes a portion covered with silver.

18. The semiconductor package according to claim 8, wherein said chip is attached to said supporting bar by thermal compress.

19. The semiconductor package according to claim 8, wherein said chip is attached to said supporting bar by silver epoxy.

* * * * *